(12) United States Patent
Deng et al.

(10) Patent No.: US 11,794,304 B2
(45) Date of Patent: Oct. 24, 2023

(54) WAFER POLISHING DEVICE

(71) Applicant: HANGZHOU SIZONE ELECTRONIC TECHNOLOGY INC., Zhejiang (CN)

(72) Inventors: Yaomin Deng, Zhejiang (CN); Yuansi Yang, Zhejiang (CN)

(73) Assignee: HANGZHOU SIZONE ELECTRONIC TECHNOLOGY INC., Zhejiang (CN)

(*) Notice: Subject to any disclaimer, the term of this patent is extended or adjusted under 35 U.S.C. 154(b) by 0 days.

(21) Appl. No.: 17/578,464

(22) Filed: Jan. 19, 2022

(65) Prior Publication Data
US 2023/0122191 A1   Apr. 20, 2023

(30) Foreign Application Priority Data

Oct. 20, 2021   (CN) .......................... 202111218264.0

(51) Int. Cl.
*B24B 37/34*   (2012.01)
*B24B 37/005*   (2012.01)
(Continued)

(52) U.S. Cl.
CPC ............ *B24B 37/34* (2013.01); *B24B 37/005* (2013.01); *B24B 37/27* (2013.01); *H01L 21/304* (2013.01)

(58) Field of Classification Search
CPC ....... B24B 37/34; B24B 37/005; B24B 37/27; B24B 37/30; B24B 37/04; B24B 37/042;
(Continued)

(56) References Cited

U.S. PATENT DOCUMENTS 5,957,751 A   9/1999   Govzman et al.
6,375,549 B1   4/2002   Glashauser et al.
(Continued)

FOREIGN PATENT DOCUMENTS

CN   103137527   6/2013
CN   110142689   8/2019
(Continued)

OTHER PUBLICATIONS

English translation of CN111251177A (Year: 2020).*
(Continued)

*Primary Examiner* — Joel D Crandall
*Assistant Examiner* — Sukwoo James Chang
(74) *Attorney, Agent, or Firm* — JCIP GLOBAL INC.

(57) ABSTRACT

The present invention discloses a wafer polishing device, which comprises a second pressure medium cavity for detecting pressure changes; a porous disc with a plurality of through holes, and its lower surface is covered with a flexible single cavity film; a conduction valve unit for conduction or isolation between the second pressure medium cavity and the third pressure medium cavity, which at least includes a conduction valve seat, a conduction valve and an elastic part. The lower end of the conduction valve seat extends into the through hole, and protrudes from the lower end face of the conduction valve seat; The conduction valve seat, the porous disc and the covered flexible single cavity membrane combined to form the third pressure medium cavity; a first pressure medium cavity.

8 Claims, 5 Drawing Sheets

(51) Int. Cl.
 *B24B 37/27* (2012.01)
 *H01L 21/304* (2006.01)

(58) Field of Classification Search
 CPC ......... B24B 37/07; B24B 37/10; B24B 49/08; B24B 49/16; B24B 7/228; H01L 21/304
 See application file for complete search history.

(56) References Cited

U.S. PATENT DOCUMENTS

| | | |
|---|---|---|
| 6,857,931 B2 | 2/2005 | Chen et al. |
| 2002/0094766 A1 | 7/2002 | Zuniga et al. |
| 2004/0048553 A1* | 3/2004 | Lee .................. B24B 37/30 451/41 |
| 2004/0067719 A1 | 4/2004 | Zuniga |
| 2022/0152777 A1 | 5/2022 | Xu et al. |

FOREIGN PATENT DOCUMENTS

| | | | |
|---|---|---|---|
| CN | 111251177 A * | 6/2020 | ............ B24B 37/30 |
| CN | 112847138 | 7/2021 | |
| EP | 1258317 | 3/2011 | |
| TW | 202134000 | 9/2021 | |
| WO | 9933613 | 7/1999 | |
| WO | 2020211260 | 10/2020 | |

OTHER PUBLICATIONS

English translation of CN110142689A (Year: 2019).*
"Office Action of Taiwan Counterpart Application", dated Sep. 30, 2022, p. 1-p. 9.
Office Action of Taiwan Counterpart Application, dated Dec. 29, 2022, pp. 1-9.
Office Action of Singapore Counterpart Application, dated Jul. 14, 2023, pp. 1-10.

* cited by examiner

WAFER POLISHING DEVICE

CROSS-REFERENCE TO RELATED APPLICATION

This application claims the priority benefit of China application serial no. 202111218264.0, filed on Oct. 20, 2021. The entirety of the above-mentioned patent application is hereby incorporated by reference herein and made a part of this specification.

BACKGROUND

Technical Field

The present invention involves a technology for manufacturing semiconductor integrated circuit chips, especially a wafer polishing device.

Description of Related Art

In the technological process of a chemical mechanical polishing (CMP) equipment, at the wafer loading bracket, the polishing head loads a wafer through the wafer loading system, and then transfers the wafer onto the polishing pad; before the planarization process, inspection needs to be performed to ensure that the wafer is tightly adsorbed onto the polishing head; after polishing is finished on the polishing table, the polishing head adsorbs the wafer from the polishing pad and transfers it to the next polishing pad for further planarization or to the wafer loading bracket for unloading. Therefore, the polishing head must have the capacity to load the wafer and corresponding mechanism to detect the wafer.

During the process of loading the wafer, by pressurizing the medium cavity inside the polishing head, the flexible film connecting with the medium cavity expands, contacts with the wafer and gradually eliminates the air and liquid between the flexible film and the wafer; after the wafer and the flexible film tightly contact, release negative pressure into the medium cavity; under upward and negative atmospheric force, the wafer adsorbed onto the flexible film can be ideally loaded onto the polishing head.

Considering the cost, most of the polishing heads available in the market adopt single-cavity medium cavity and flexible single-cavity film. The working mechanism of the single-cavity medium cavity and the flexible single-cavity film is a negative conduction mechanism: Release negative pressure into the single-cavity medium cavity; when the wafer is ideally loaded onto the flexible film, the pin with big cross-sectional area unloads partial of the force transmitted to the guide rod, so the conduction can't be realized for the conduction valve; when the wafer is not loaded or not ideally loaded onto the flexible film, under atmospheric pressure, a hard contact between the flexible film in the holes and the pin is realized, atmospheric pressure is transmitted to the guide rod, so the conduction is realized for the conduction valve. In another word, the mechanism of that "when the wafer is ideally loaded under negative pressure, the conduction can't be realized for the medium cavity; when the wafer is not loaded or not ideally loaded, the conduction can be realized for the medium cavity" is called negative conduction mechanism.

Compared with the forward conduction mechanism, the negative conduction mechanism has three disadvantages: 1) Delay: under the negative conduction mechanism, loading state of the wafer can only be logically judged after loading is finished and the pressure feedback value of the sealed detection cavity becomes stable; under the forward conduction mechanism, when the wafer is loaded, the conduction can be realized in a very short time for the medium cavity, therefore, loading state of the wafer can be logically judged in advance; 2) Misjudgment risk: under the forward conduction mechanism, a proportion of the action area (action area/wafer area) of the multi-cavity flexible film contacting with the wafer is big, the pin is small, and the negative pressure required for realizing the conduction for the conduction valve is low; under the negative conduction mechanism, the force applied on the wafer mainly go through multiple holes, a proportion of the action area is small, the pin is big, when the wafer is not loaded or not ideally loaded, the negative pressure required for realizing the relatively fast conduction for the conduction valve (to judge whether the wafer is not loaded/not ideally loaded) is high; such high negative pressure results in high pressure on multiple holes when the wafer is ideally loaded, the conduction can be realized for the conduction valve, so there is misjudgment risk; in addition, the incorrect conduction may be realized for the conduction valve due to many factors, such as decreasing of the elastic modulus of the flexible film as time passes by; 3) High risk of wafer fragments: under the negative conduction and excessive negative pressure, the atmospheric pressure applied on the wafer surface is excessively high, and there is risk of wafer fragments.

SUMMARY

In order to overcome the shortcomings of prior arts, the present invention provides a wafer polishing device which supports accurate and fast judgment over adsorbing state of the wafer, and causes no risk of wafer fragments.

The technical scheme adopted by the present invention to solve above technical issues is: a wafer polishing device comprising:

a second pressure medium cavity used for detecting pressure changes;

a porous disc with a plurality of through-holes, a lower surface of the porous disc is covered with a flexible single-cavity film for supporting a wafer;

a conduction valve unit disposed between the second pressure medium cavity and the third pressure medium cavity; the conduction valve unit is used for conduction or isolation between the second pressure medium cavity and the third pressure medium cavity; the conduction valve unit at least comprises a conduction valve seat, a conduction valve which can move relative to the conduction valve seat and an elastic part which pushes against the conduction valve, the lower end of the conduction valve seat extends into the through-hole, and the lower end of the conduction valve protrudes beyond the lower end surface of the conduction valve seat;

the conduction valve seat, the porous disc and the covered flexible single-cavity film combine to form the third pressure medium cavity;

a first pressure medium cavity used for controlling upward and downward movements of the porous disc, the second pressure medium cavity and the third pressure medium cavity;

when a negative pressure is formed in the third pressure medium cavity so that the wafer is adsorbed on the porous disc and the flexible single-cavity film, the conduction valve moves relative to the conduction valve seat against the force generated by the elastic part to connect the second pressure medium cavity and the third pressure medium cavity.

In the present invention, through cooperation of the conduction valve and the conduction valve seat, when a wafer is tightly adsorbed onto the porous disc and the flexible single-cavity film, the adsorption force applied on the wafer is transmitted to the elastic part through the flexible single-cavity film and the conduction valve, the conduction is realized for the conduction valve unit, that is, the conduction between the second pressure medium cavity and the third pressure medium cavity; the present invention changes traditional negative conduction mechanism of the flexible single-cavity film, supports faster and more accurate judgment over loading state of the wafer by the polishing device, improves the accuracy, timeliness and safety of judgment over adsorbing state of the wafer, does not require multiple gas pathway systems, and therefore reduces cost.

Further, when the third pressure medium cavity is under negative pressure state, the lower end surface of the conduction valve seat is even with the lower surface of the porous disc.

The lower end surface of the conduction valve seat being even with the lower surface of the porous disc can facilitate a uniform distribution of the force supporting the wafer; when there is no conduction valve seat structure or the lower end surface of the conduction valve seat extrudes much beyond the lower surface of the porous disc, the flexible single-cavity film is in the through-holes area, and under the negative pressure in the third pressure medium cavity, excessive deformation will occur; when such deformation is high under the influence of the negative pressure, the upward and negative pressure easily gets higher than the force needed for the conduction of the elastic part, so the conduction between the second pressure medium cavity and the third pressure medium cavity can be realized.

Further, the inner diameter of the through-hole is bigger than the outer diameter of the conduction valve seat, so that a gap is formed between the outer wall of the conduction valve seat and the inner wall of the through-hole, enabling the flexible single-cavity film deform in the gap, the negative pressure space is broadened, and the adsorption force applied on the wafer is increased.

Setting the gap enables forming a similarly ring-shaped negative pressure space by the flexible single-cavity film between the conduction valve seat and the through-holes when adsorbing the wafer with the negative pressure, an adsorption force for the wafer is generated in the space, and the overall wafer adsorption force is increased.

Further, set the radial width of the gap as S, set the thickness of the flexible single-cavity film as H, then $S \geq 2H$. When $S \geq 2H$, under the negative pressure in the third pressure medium cavity, the flexible single-cavity film deforms and bends upward and toward inside of the gap, a negative pressure area is formed between the flexible single-cavity film and the wafer, the wafer is adsorbed. On the contrary, when $S < 2H$, the flexible single-cavity film does not deform, the wafer adsorption force is decreased, and the polishing device may easily fail to load the wafer.

Further, set the length of the conduction valve protruding from the lower end surface of the conduction valve seat as D, then $D \geq 1/10 H$. For the length D, the thickness and compressibility of the flexible single-cavity film shall be fully considered. During the process of adsorbing the wafer with the negative pressure in the third pressure medium cavity, the wafer moves upward under the negative pressure; the negative pressure is transmitted from the wafer, through the flexible single-cavity film and to the conduction valve, so the flexible single-cavity film is partially compressed and deformed under the compressive stress of the conduction valve. When the length D is smaller than the compression and deformation amount of the flexible single-cavity film, the wafer can't realize the movement of the conduction valve. $1/10 H$ is the minimum compression and deformation amount of the flexible single-cavity film.

Further, set the outer diameter of the lower end surface of the conduction valve seat as d1, set the outer diameter of the conduction valve as d2, then $d1 \geq d2 + H$. When no wafer is adsorbed, under the negative pressure in the third pressure medium cavity, the flexible single-cavity film compresses, deforms upward, finally contacts with and wraps the end of the conduction valve and the lower end surface of the conduction valve seat, the lower end surface of the conduction valve seat supports the flexible single-cavity film, the conduction valve is only under the negative pressure from the flexible single-cavity film at partial of the end; such negative pressure is much lower than the pretightening force applied by the elastic part onto the conduction valve; therefore, when there is no wafer is adsorbed, the flexible single-cavity film can't realize the conduction between the second pressure medium cavity and the third pressure medium cavity, and it can be judged that the polishing device does not adsorb the wafer. The key size relationship is $d1 \geq d2 + H$, only under such condition, the conduction valve seat can support the flexible single-cavity film.

Relevant parameters of the conduction valve, including S, D, d1 and d2, can be comprehensively adjusted upon theoretical calculations, so that during design, the vacuum conditions for adsorbing the wafer can be decreased and the risk of wafer fragments can be largely reduced.

Further, the center of the conduction valve seat coincides with the center of the through-hole where the conduction valve seat is located.

Further, the through-holes are circular, oval, quadrilateral or special-shaped, or of a combination of at least two of above shapes.

The beneficial effects of the present invention include: 1) Change traditional negative conduction mechanism for the flexible single-cavity film, support accurate and fast judgment over loading state of the wafer, improve the efficiency of wafer loading; 2) Decrease loading pressure and reduce the risk of wafer fragments; 3) Do not require multiple gas pathway systems and therefore reduce cost.

DESCRIPTION OF THE EMBODIMENTS

In order to enable those skilled in the art to better understand the scheme of the present invention, the technical schemes for specific embodiments of the present invention are clearly and fully described below in conjunction with the accompanying drawings of such embodiments. It is obvious that following embodiments are only certain rather than all embodiments of the present invention. All the other embodiments of the present invention, which are obtained by those skilled in the art on basis of following embodiments and without creative works, are within the protection scope of the present invention.

Figure 1:
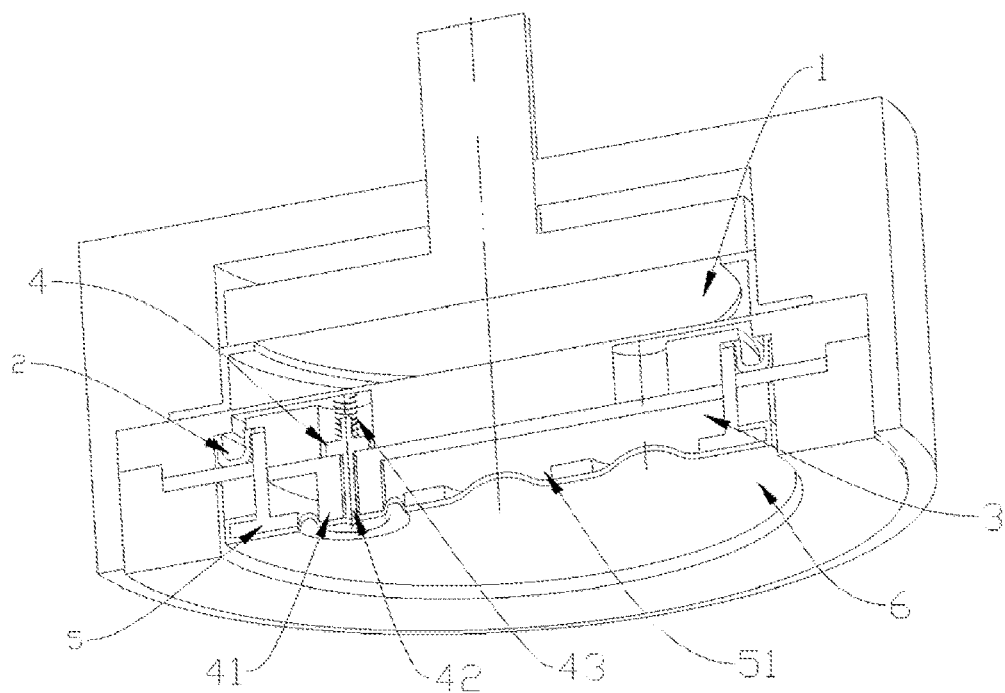
FIG. 1 is a sectional stereo view of the present invention.
Figure 2:
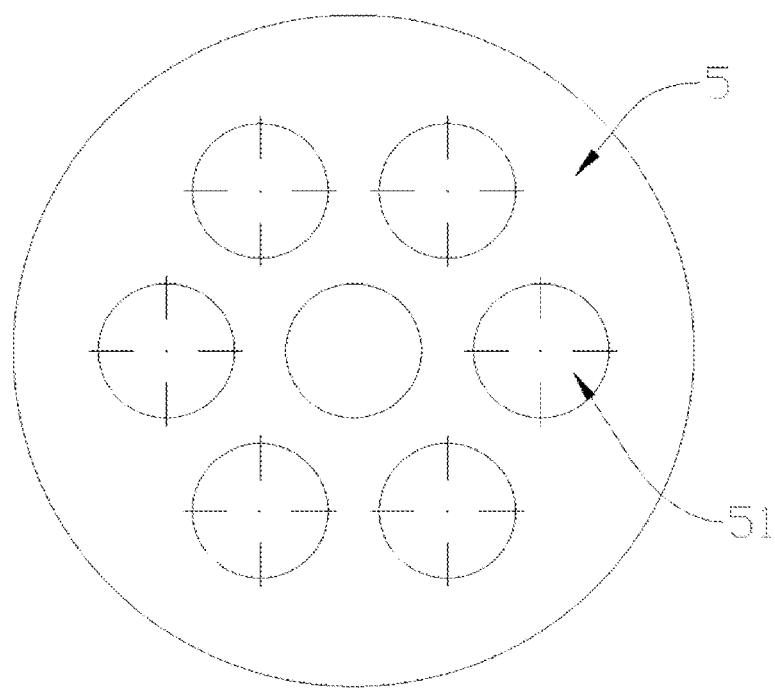
FIG. 2 is a vertical view of the porous disc under the present invention.
Figure 3:
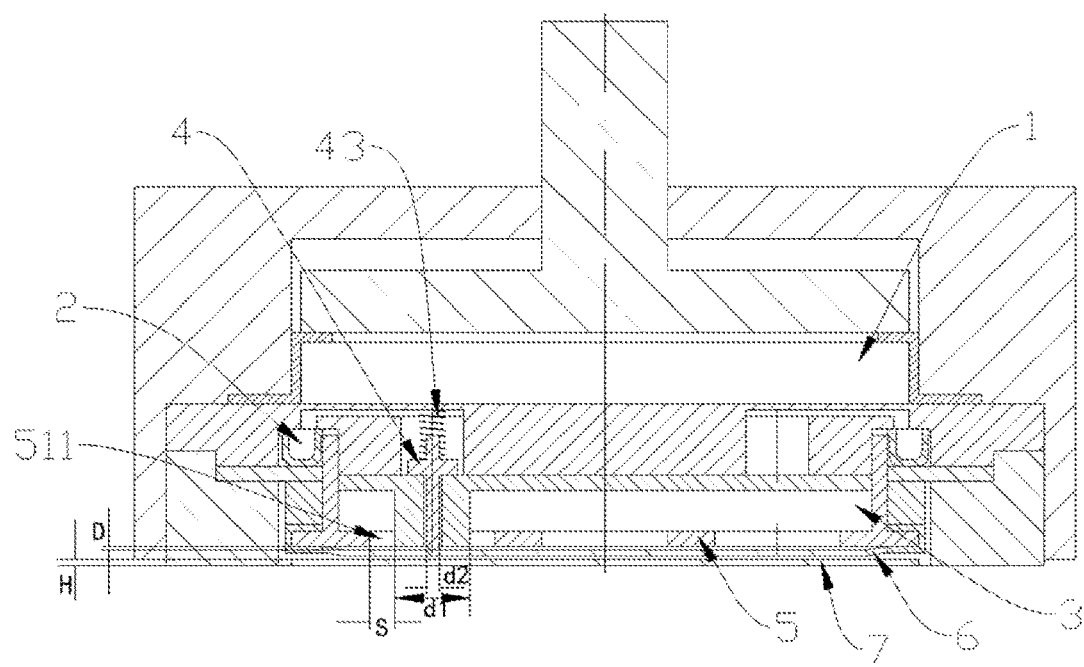
FIG. 3 is a sectional view of the present invention without adsorbing a wafer.

As shown in FIGS. 1-3, a wafer polishing device comprising a first pressure medium cavity 1, a second pressure medium cavity 2, a third pressure medium cavity 3, a porous disc 5, a flexible single-cavity film 6 and a conduction valve unit 4.

The second pressure medium cavity 2 is also called as the detection cavity, the second pressure medium cavity 2 is used for detecting pressure changes in order to judge whether a wafer 7 is loaded on basis of the pressure change in the second pressure medium cavity 2.

The porous disc 5 is made of rigid material, the porous disc 5 has a plurality of through-holes 51, and lower surface of the porous disc 5 is covered with the flexible single-cavity film 6; the lower surface of the porous disc 5 is flat, when the flexible single-cavity film 6 adsorbs the wafer 7, the porous disc 5 may be used as a main support member of the wafer 7, wherein the flexible single-cavity film 6 deforms over the through-holes 51, forms a negative pressure space together with the wafer 7, and provides pressure for the wafer 7 to be adsorbed onto the porous disc 5.

The conduction valve unit 4 is disposed between the second pressure medium cavity 2 and the third pressure medium cavity 3; the conduction valve unit 4 is used for conduction or isolation between the second pressure medium cavity 2 and the third pressure medium cavity 3; the conduction valve unit 4 at least comprises a conduction valve seat 41, a conduction valve 42 which can move relative to the conduction valve seat 41, and an elastic part 43 which pushes against the conduction valve 42, the lower end of the conduction valve seat 41 extends into the through-hole 51, and the lower end of the conduction valve 42 protrudes beyond the lower end surface of the conduction valve seat 41.

Specifically, define the length of the conduction valve 42 protruding beyond the lower end surface of the conduction valve seat 41 as D, set the thickness of the flexible single-cavity film 6 as H, then $D \geq \frac{1}{10}H$.

More specifically, in this embodiment, the conduction valve seat 41 is nearly cylindrical and has a hole in the center, the through-holes 51 are circular, the center of the conduction valve seat 41 coincides with the center of the through-hole 51 where the conduction valve seat 41 is located, in another word, they are set in a concentric and coaxial manner; set the outer diameter of the lower end surface of the conduction valve seat 41 as d1, set the outer diameter of the conduction valve 42 as d2, then $d1 \geq d2+H$.

Of course, the conduction valve seat 41 may also have other structures in other embodiments, not limited to cylindrical; the through-holes 51 may also be oval, quadrilateral or other special-shaped shapes; or the porous disc 5 has the through-holes with various shapes; the conduction valve seat 41 and the through-hole 51 may be set not in a concentric and coaxial manner.

The conduction valve seat 41, the through-holes 51 and the covered flexible single-cavity film 6 combined to form the third pressure medium cavity 3; the first pressure medium cavity 1 is used for controlling upward and downward movements of the porous disc 5, the second pressure medium cavity 2 and the third pressure medium cavity 3.

Negative pressure is formed in the third pressure medium cavity 3, when the wafer 7 is adsorbed onto the porous disc 5, the conduction valve 42 moves relative to the conduction valve seat 41 against the force generated by the elastic part 43 to connect the second pressure medium cavity 2 and the third pressure medium cavity 3.

Figure 6:
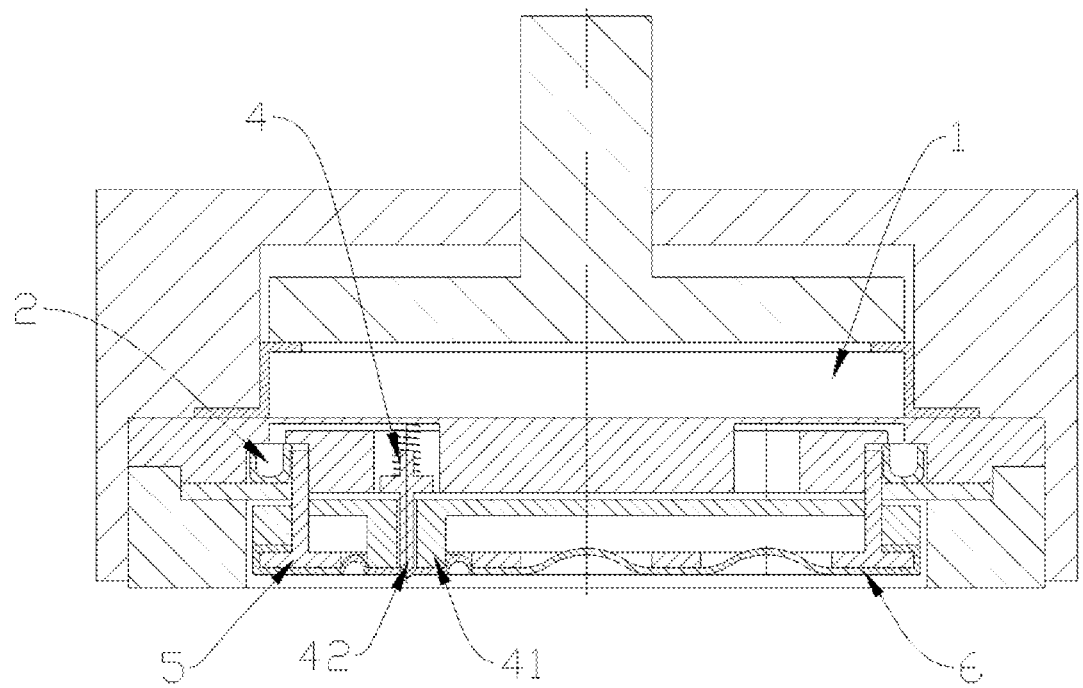
FIG. 6 is a sectional view of the present invention under the negative pressure and without adsorbing a wafer.

When the porous disc 5 does not adsorb or does not tightly adsorb the wafer 7, the flexible single-cavity film 6 wraps the end surface of the conduction valve 42, such force is not strong enough to overcome the force generated by the elastic part 43, as shown in FIG. 6, the conduction valve 42 does not move relative to the conduction valve seat 41, therefore, the conduction between the second pressure medium cavity 2 and the third pressure medium cavity 3 can't be realized, the second pressure medium cavity 2 and the third pressure medium cavity 3 are isolated. In another word, the wafer polishing device under the present invention judges whether a wafer is well adsorbed through forward conduction mechanism.

If the wafer 7 is tightly adsorbed, in order to realize a more uniform force, when the third pressure medium cavity 3 is under negative pressure state, the lower end surface of the conduction valve seat 41 is even with the lower surface of the porous disc 5.

In order to prevent low adsorption force applied on the wafer 7 at the position of the conduction valve seat 41, the inner diameter of the through-hole 51 is bigger than the outer diameter of the conduction valve seat 41, so that a gap 511 for deforming the flexible single-cavity film 6 is formed between the outer wall of the conduction valve seat 41 and the inner wall of one of the through-holes 51.

Specifically, set the radial width of the gap 511 as S, set the thickness of the flexible single-cavity film 6 as H, then $S \geq 2H$, as shown in FIG. 3.

Figure 4:
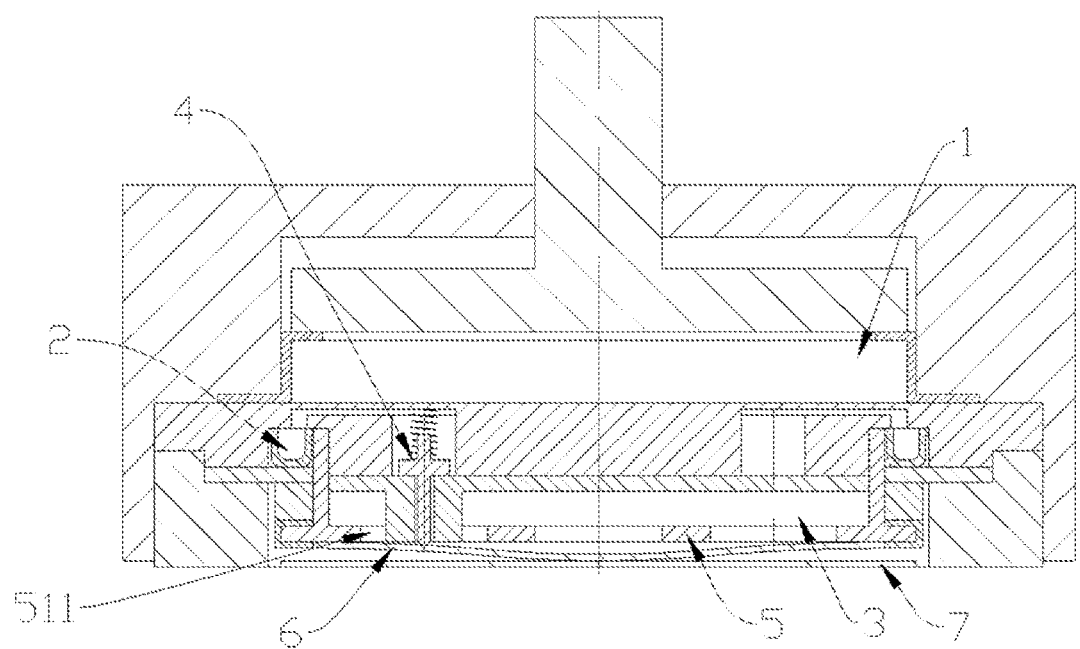
FIG. 4 is a sectional view of the present invention when the flexible single-cavity film starts to deform.
Figure 5:
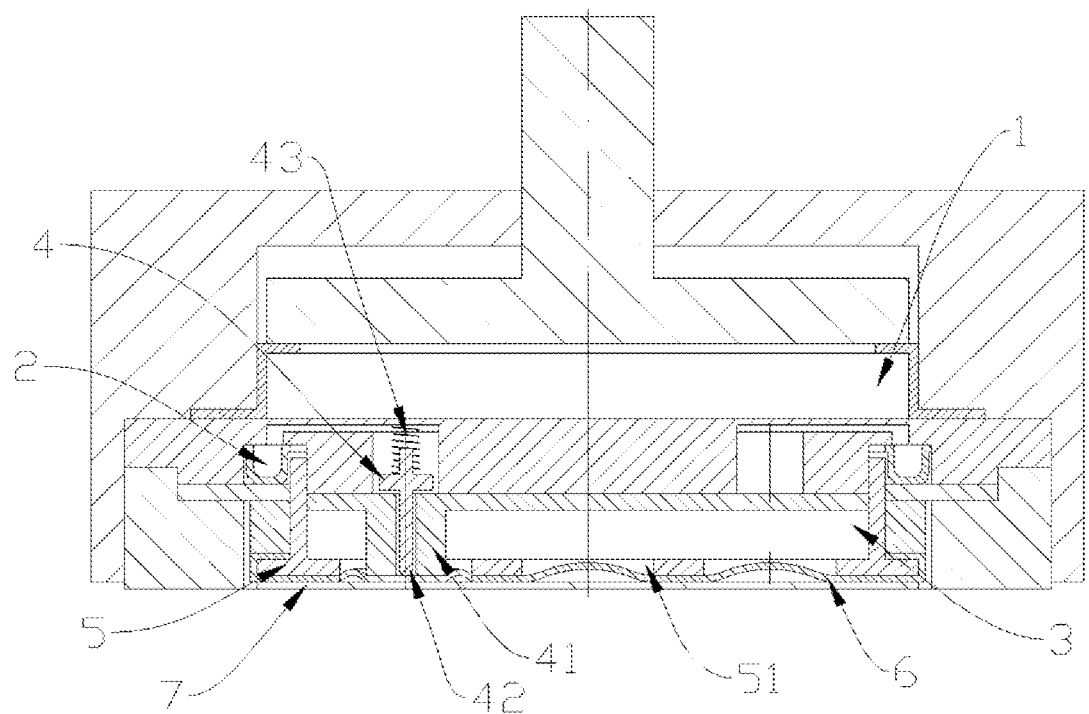
FIG. 5 is a sectional view of the present invention when a wafer is adsorbed with the negative pressure.

Working process of the present invention is that: when the wafer 7 needs to be clamped in the loading bracket or onto the polishing pad, the first pressure medium cavity 1 pressurizes vertically and drives the second pressure medium cavity 2 and the third pressure medium cavity 3 downward, the polishing device is directly above the wafer 7 on the loading bracket or the polishing pad, as shown in FIG. 3;

pressurize the second pressure medium cavity 2 and the third pressure medium cavity 3, the flexible single-cavity film 6 undergoes an arc-shaped deformation, the flexible single-cavity film 6 and the wafer 7 gradually reach outside from the center of the wafer 7 while the air and liquid between the flexible single-cavity film 6 and the wafer 7 are eliminated, and a tight fitting is formed, as shown in FIG. 4;

keep the second pressure medium cavity 2 under pressure maintaining state, release negative pressure into the third pressure medium cavity 3 which tightly adsorbs the wafer 7, the flexible single-cavity film 6 and the wafer 7 move upward under the negative atmospheric force, arrive at the porous disc 5 and continuously bear pressure as a whole over the through-holes 51 of the porous disc 5; on one hand, with the presence of the wafer 7, the negative pressure space formed by the flexible single-cavity film 6 is relatively big; on the other hand, atmospheric pressures from all directions are transmitted through the wafer 7 to the flexible single-cavity film 6, and through the conduction valve 42 to the elastic part 43; when the upward stroke of the moving parts reaches a certain threshold, the conduction valve 42 moves upward, the conduction of the conduction valve 42 is realized, the conduction between the second pressure medium cavity 2 and the third pressure medium cavity 3 is also realized, and negative pressure is formed, as shown in FIG. 5.

When the wafer 7 is adsorbed onto the flexible single-cavity film 6, main bodies of the wafer 7, the flexible single-cavity film 6 and the porous disc 5 are overlaid and parallel, meanwhile, parts of the lower surface of the conduction valve seat 41, the wafer 7 and the flexible single-cavity film 6 are overlaid and parallel; under such conditions, the wafer 7 is under a uniformly distributed force and is not easy to be broken.

Figure 7:
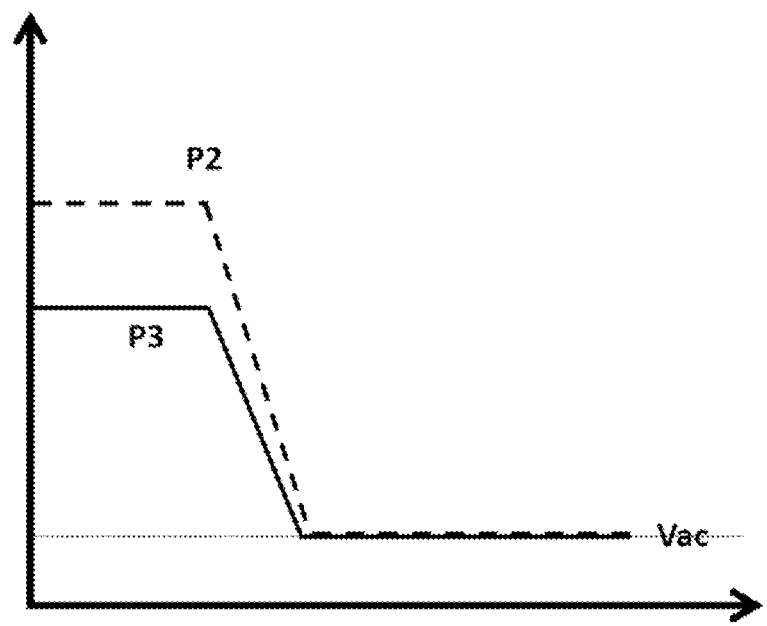
FIG. 7 is pressure feedback curves of the second pressure medium cavity and the third pressure medium cavity when the present invention is tightly adsorbing a wafer.

After the conduction is realized, continuous negative pressure supports the wafer 7 upward to realize being tightly adsorbed, the pressure feedback curves of the second pressure medium cavity 2 and the third pressure medium cavity 3 are respectively shown as P2 and P3 in FIG. 7.

Figure 8:
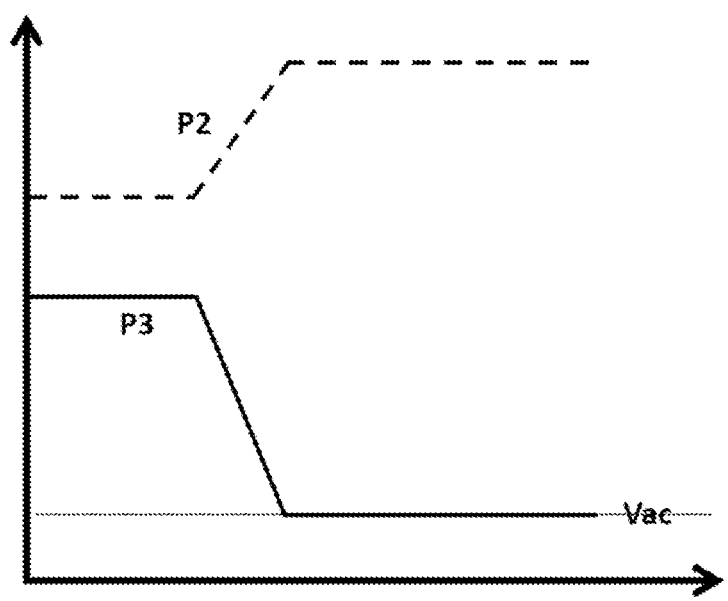
FIG. 8 is pressure feedback curves of the second pressure medium cavity and the third pressure medium cavity when the present invention is not adsorbing a wafer.

When the polishing device does not ideally load the wafer 7, the conduction between the second pressure medium cavity 2 and the third pressure medium cavity 3 can't be realized. When the conduction is not realized, the third pressure medium cavity 3 compresses the second pressure medium cavity 2, the pressure feedback value of the second pressure medium cavity 2 raises and finally maintains stable. When the wafer 7 is not loaded or not ideally loaded, the pressure feedback curves of the second pressure medium cavity 2 and the third pressure medium cavity 3 are as shown in FIG. 8.

Comparative Embodiment

Figure 9:
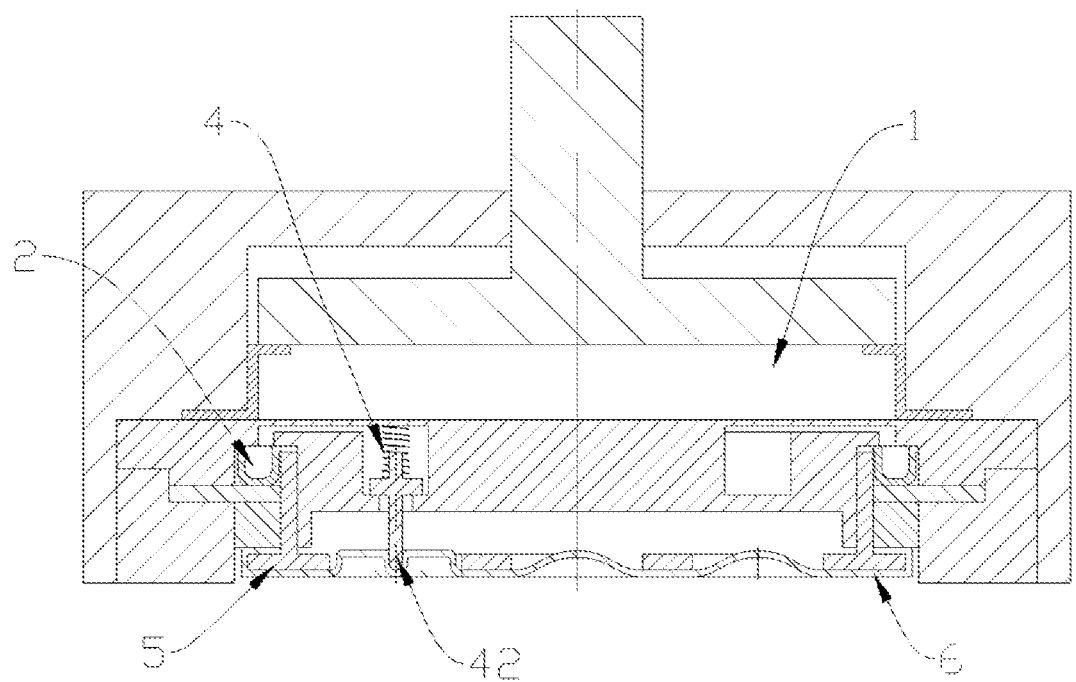
FIG. 9 is a sectional view of the polishing device without adsorbing a wafer in the comparative embodiment.

As shown in FIG. 9, the difference between the present embodiment and embodiment I is that, the embodiment does not have the conduction valve seat 41.

When the polishing device does not load the wafer 7, as shown in FIG. 9, under the negative pressure, the flexible single-cavity film 6 shrinks into the through-holes 51 of the porous disc 5, the flexible single-cavity film 6 basically fits to the through-holes 51 of the porous disc 5 due to the absence of the wafer 7, without big-area supporting the flexible single-cavity film 6 by the lower surface of the conduction valve seat 41, due to the flexibility of the flexible single-cavity film 6, so the conduction can't be realized for the conduction valve 42 only with the force, which is generated along the outer wall of lower part of the conduction valve 42 and transmitted upward to the elastic part 43.

Above specific embodiments are used to illustrate rather than to limit the present invention, within the protection scope of the spirits and claims of the present invention, any modification or change to the present invention shall fall into the protection scope of the present invention.

What is claimed is:

1. A wafer polishing device comprising:
   a second pressure medium cavity used for detecting pressure change;
   a porous disc with a plurality of through-holes, a lower surface of the porous disc is covered with a flexible single-cavity film for supporting a wafer;
   a conduction valve unit disposed between the second pressure medium cavity and a third pressure medium cavity, the conduction valve unit is used for conduction or isolation between the second pressure medium cavity and the third pressure medium cavity, the conduction valve unit at least comprises a conduction valve seat, a conduction valve which can move relative to the conduction valve seat, and an elastic part which pushes against the conduction valve, a lower end of the conduction valve seat extends into the through-hole, a lower end of the conduction valve protrudes beyond a lower end surface of the conduction valve seat;
   the conduction valve seat, the porous disc and the flexible single-cavity film combine to form the third pressure medium cavity;
   a first pressure medium cavity used for controlling upward and downward movements of the porous disc, the second pressure medium cavity and the third pressure medium cavity;
   when a negative pressure is formed in the third pressure medium cavity and the wafer is adsorbed onto the porous disc and the flexible single-cavity film, the conduction valve moves relative to the conduction valve seat against a force generated by the elastic part to connect the second pressure medium cavity and the third pressure medium cavity.

2. The wafer polishing device according to claim 1, wherein when the third pressure medium cavity is under negative pressure state, the lower end surface of the conduction valve seat is even with the lower surface of the porous disc.

3. The wafer polishing device according to claim 1, wherein an inner diameter of the through-hole is bigger than an outer diameter of the conduction valve seat, so that a gap for deforming the flexible single-cavity film is formed between an outer wall of the conduction valve seat and an inner wall of the through-hole.

4. The wafer polishing device according to claim 3, wherein a radial width of the gap is defined as S, a thickness of the flexible single-cavity film is defined as H, and S≥2H.

5. The wafer polishing device according to claim 4, wherein a length of the conduction valve protruding beyond the lower end surface of the conduction valve seat is defined as D, and D≥1/10H.

6. The wafer polishing device according to claim 5, wherein an outer diameter of the lower end surface of the conduction valve seat is defined as d1, an outer diameter of the conduction valve is defined as d2, and d1≥d2+H.

7. The wafer polishing device according to claim 1, wherein a center of the conduction valve seat coincides with a center of the through-hole where the conduction valve seat is located.

8. The wafer polishing device according to claim 1, wherein the through-holes are circular, oval, quadrilateral or special-shaped, or a combination of at least two of above shapes.

* * * * *